(12) United States Patent
Minobe et al.

(10) Patent No.: US 11,307,525 B2
(45) Date of Patent: Apr. 19, 2022

(54) PRINTED CIRCUIT BOARD MOUNTING PIEZOELECTRIC TRANSFORMER

(71) Applicant: CANON KABUSHIKI KAISHA, Tokyo (JP)

(72) Inventors: Taro Minobe, Ichikawa (JP); Norikazu Sugiyama, Susono (JP); Ryo Matsumura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 39 days.

(21) Appl. No.: 16/859,139

(22) Filed: Apr. 27, 2020

(65) Prior Publication Data

US 2020/0257234 A1    Aug. 13, 2020

Related U.S. Application Data

(62) Division of application No. 15/887,060, filed on Feb. 2, 2018, now Pat. No. 10,671,009.

(30) Foreign Application Priority Data

Feb. 13, 2017 (JP) .............................. JP2017-024262
Feb. 13, 2017 (JP) .............................. JP2017-024263

(51) Int. Cl.
*G03G 15/00* (2006.01)
*H01L 41/04* (2006.01)
(Continued)

(52) U.S. Cl.
CPC ........... *G03G 15/80* (2013.01); *H01L 41/044* (2013.01); *H01L 41/053* (2013.01);
(Continued)

(58) Field of Classification Search
CPC ..... G03G 15/80; H01L 41/044; H01L 41/053; H01L 41/107; H02M 3/33507
(Continued)

(56) References Cited

U.S. PATENT DOCUMENTS

| 5,010,445 A | 4/1991 | Weinold |
| 9,307,634 B2 | 4/2016 | Sugiyama et al. |

(Continued)

FOREIGN PATENT DOCUMENTS

| JP | H08-289568 A | 11/1996 |
| JP | H11-234083 A | 8/1999 |

(Continued)

OTHER PUBLICATIONS

Machine Translation of Yamaguchi (Japanese Patent Publication No. 2006-059875) Mar. 2, 2006 (Year: 2006).*

(Continued)

*Primary Examiner* — Tremesha S Willis
(74) *Attorney, Agent, or Firm* — Venable LLP

(57) ABSTRACT

A printed circuit board comprises a first mounting surface, a second mounting surface, and a piezoelectric transformer. The piezoelectric transformer has a piezoelectric substance, external electrodes, and a frame substrate. The second mounting surface has a projection region. There is a first region from a first location, where an end portion further from the output electrode out of end portions of the input electrode is projected onto the second mounting surface in the projection region, to a second location, where an end portion closer to the output electrode out of the end portions of the input electrode is projected onto the second mounting surface, the first region being a mounting allowed region where an electronic component is mounted.

14 Claims, 12 Drawing Sheets

(51) Int. Cl.
*H02M 3/335* (2006.01)
*H01L 41/107* (2006.01)
*H05K 3/30* (2006.01)
*H05K 3/34* (2006.01)
*H01L 41/053* (2006.01)
*H05K 1/18* (2006.01)

(52) U.S. Cl.
CPC ...... *H01L 41/107* (2013.01); *H02M 3/33507* (2013.01); *H05K 3/303* (2013.01); *H05K 3/3415* (2013.01); *H05K 1/181* (2013.01); *H05K 3/3494* (2013.01); *H05K 2201/10083* (2013.01); *H05K 2201/10545* (2013.01); *H05K 2203/1572* (2013.01)

(58) Field of Classification Search
USPC .......................................................... 361/760
See application file for complete search history.

(56) References Cited

U.S. PATENT DOCUMENTS

| | | |
|---|---|---|
| 2009/0146535 A1 | 6/2009 | Machida et al. |
| 2013/0004196 A1 | 1/2013 | Nagasaki et al. |
| 2014/0036546 A1 | 2/2014 | Minobe |
| 2017/0194876 A1 | 7/2017 | Minobe |

FOREIGN PATENT DOCUMENTS

| | | | |
|---|---|---|---|
| JP | 2006-059875 A | 3/2006 |
| JP | 2006-108332 A | 4/2006 |
| JP | 2006-158033 A | 6/2006 |
| JP | 2008-193801 A | 8/2008 |
| JP | 2009-128416 A | 6/2009 |
| JP | 2013-033929 A | 2/2013 |
| JP | 2016-076577 A | 5/2016 |
| WO | 2009/072474 A | 4/2011 |

OTHER PUBLICATIONS

Nov. 6, 2020 Office Action in Japanese Patent Application No. 2017-024262.
Nov. 27, 2020 Office Action in Japanese Patent Application No. 2017-024263.

* cited by examiner

FIG. 6

| SUBSTRATE | | | | FRAME SUBSTRATE 104 | | | | | | | | |
|---|---|---|---|---|---|---|---|---|---|---|---|---|
| | | | | CEM-3 | | | | FR-4 | | | | |
| | ORIENTATION | | | LONGITUDINAL DIRECTION | | HORIZONTAL DIRECTION | | LONGITUDINAL DIRECTION | | HORIZONTAL DIRECTION | | |
| | | | COEFFICIENT OF THERMAL EXPANSION | 20ppm/°C | 25ppm/°C | 23ppm/°C | 28ppm/°C | 10ppm/°C | 14ppm/°C | 12ppm/°C | 16ppm/°C |
| PRINTED CIRCUIT BOARD 50 | CEM-3 | LONGITUDINAL DIRECTION | 20ppm/°C | 0 | 5 | 3 | 8 | 10 | 6 | 8 | 4 |
| | | HORIZONTAL DIRECTION | 25ppm/°C | 5 | 0 | 2 | 3 | 15 | 11 | 13 | 9 |
| | | LONGITUDINAL DIRECTION | 23ppm/°C | 3 | 2 | 0 | 5 | 13 | 9 | 11 | 7 |
| | | HORIZONTAL DIRECTION | 28ppm/°C | 8 | 3 | 5 | 0 | 18 | 14 | 16 | 12 |
| | FR-4 | LONGITUDINAL DIRECTION | 10ppm/°C | 10 | 15 | 13 | 18 | 0 | 4 | 2 | 6 |
| | | HORIZONTAL DIRECTION | 14ppm/°C | 6 | 11 | 9 | 14 | 4 | 0 | 2 | 2 |
| | | LONGITUDINAL DIRECTION | 12ppm/°C | 8 | 13 | 11 | 16 | 2 | 2 | 0 | 4 |
| | | HORIZONTAL DIRECTION | 16ppm/°C | 4 | 9 | 7 | 12 | 6 | 2 | 4 | 0 |

※ THICK FRAME : COMBINATION FOR WHICH HEAT CYCLE TEST WAS PERFORMED

※ DIAGONAL LINE : CRACKS OCCURRED

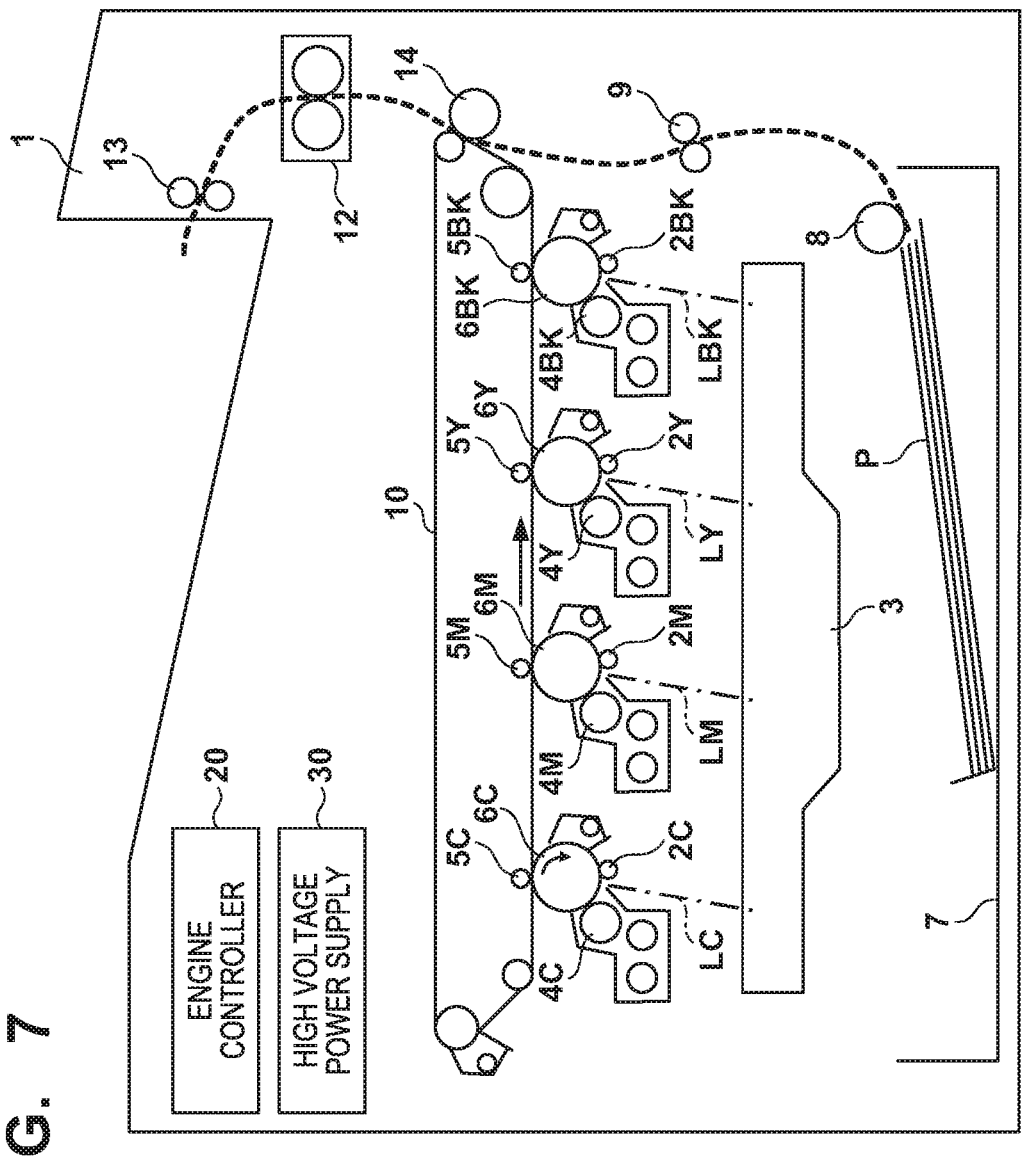

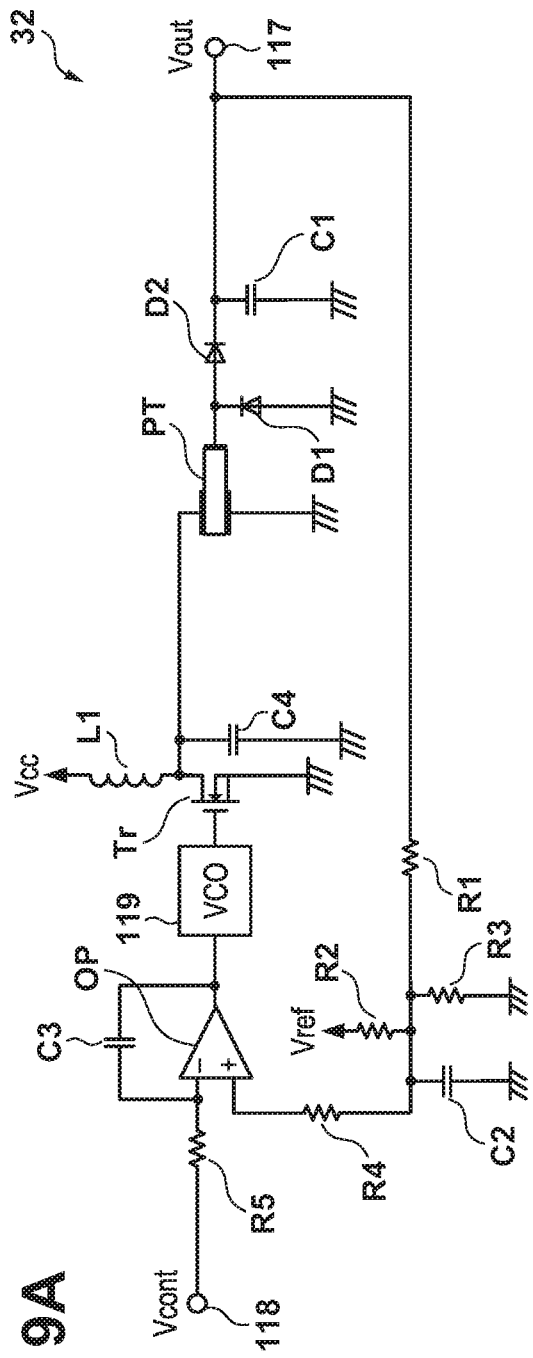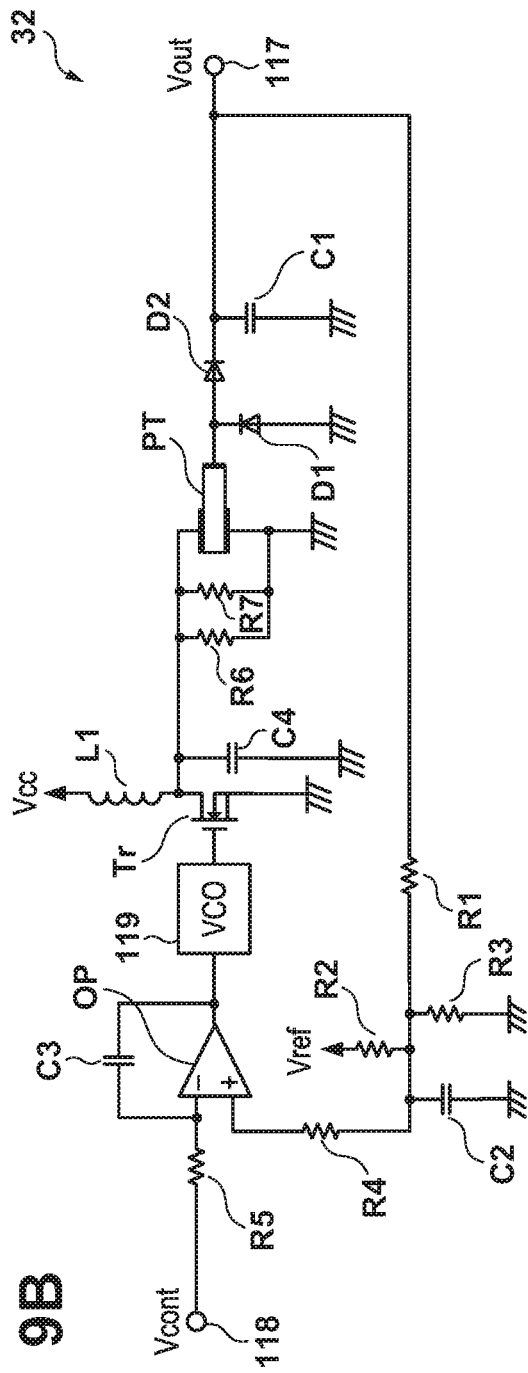

FIG. 13

| R6 | R7 | R6+R7 | PROTECTION EFFECT | POWER SUPPLY PERFORMANCE |
|---|---|---|---|---|
| 4.7 [kΩ] | 4.7 [kΩ] | 2.4 [kΩ] | ○ | ✕ |
| 12.0 [kΩ] | 12.0 [kΩ] | 6.0 [kΩ] | ○ | ○ |
| 1.0 [MΩ] | 1.0 [MΩ] | 0.5 [MΩ] | ○ | ○ |
| 3.0 [MΩ] | 3.0 [MΩ] | 1.5 [MΩ] | ○ | ○ |
| 10.0 [MΩ] | 10.0 [MΩ] | 5.0 [MΩ] | △ | ○ |
| 1000.0 [MΩ] | 1000.0 [MΩ] | 500.0 [MΩ] | ✕ | ○ |

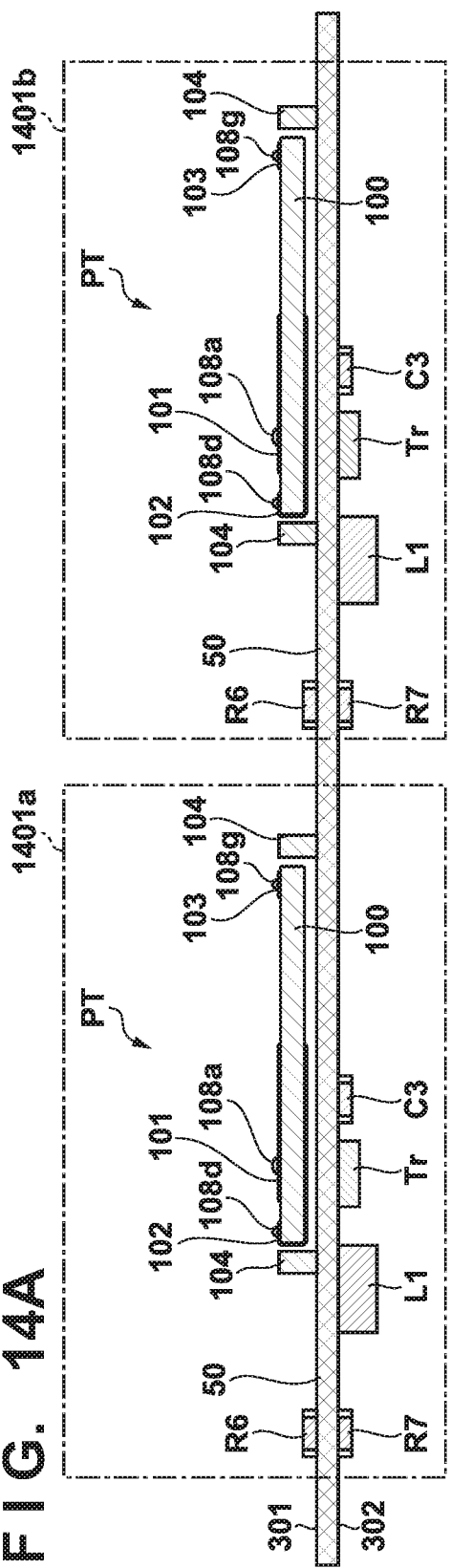
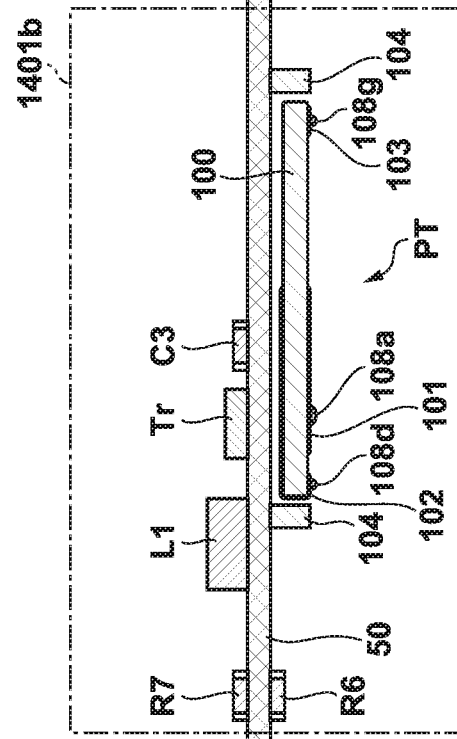
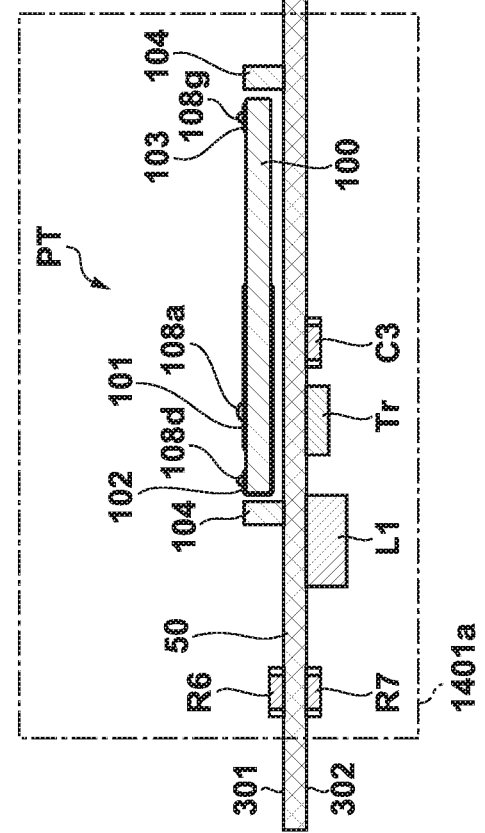

PRINTED CIRCUIT BOARD MOUNTING PIEZOELECTRIC TRANSFORMER

BACKGROUND OF THE INVENTION

Field of the Invention

The present invention relates to a printed circuit board mounting a piezoelectric transformer, a power supply apparatus, and an image forming apparatus.

Description of the Related Art

An electrophotographic type image forming apparatus has a power supply apparatus for generating a charging voltage, a developing voltage, and a transfer voltage. These voltages are high voltages, and are generated using a piezoelectric transformer. By Japanese Patent Laid-Open No. 2006-108332, a piezoelectric transformer that accommodates a plate-shaped piezoelectric ceramic in a resin case and has a pin terminal protruding from the resin case is proposed. By Japanese Patent Laid-Open No. 2016-76577, a surface mount (SMT) type piezoelectric transformer is recited.

In recent years, a double-sided printing substrate capable of mounting a plurality of electronic components on a single printed circuit board has been developed. When the resin case type piezoelectric transformer recited in Japanese Patent Laid-Open No. 2006-108332 is mounted to a double-sided printing substrate on a first surface, it is not possible to arrange a component near a land on a second surface where a pin is soldered. In contrast, in the case of a surface-mounted type piezoelectric transformer, mounting is performed to a land on a first surface, and therefore a second surface can be effectively used. However, an electric field or the like generated from a piezoelectric transformer exerts an influence on the performance of electronic components mounted on a second surface. Accordingly, it is not the case that electronic components can be mounted to all regions of the second surface.

SUMMARY OF THE INVENTION

The present invention promotes high-density integration of electronic components on a printed circuit board capable of mounting electronic components on both surfaces.

The present invention provides a printed circuit board comprising: a first mounting surface; a second mounting surface that is a surface opposite the first mounting surface; and a piezoelectric transformer surface-mounted to the first mounting surface, wherein the piezoelectric transformer has a piezoelectric substance having an input electrode and an output electrode, a plurality of external electrodes electrically connected to the input electrode or the output electrode, and a frame substrate that supports the piezoelectric substance and is arranged to surround side surfaces of the piezoelectric substance, the second mounting surface has a projection region onto which the piezoelectric substance is projected, and a first region is provided in the projection region, the first region located from a first location to a second location, the first location being a location where an end portion further from the output electrode out of end portions of the input electrode is projected onto the second mounting surface, the second location being a location where an end portion closer to the output electrode out of the end portions of the input electrode is projected onto the second mounting surface, and the first region being a mounting allowed region where an electronic component is mounted.

Further features of the present invention will become apparent from the following description of exemplary embodiments (with reference to the attached drawings).

BRIEF DESCRIPTION OF THE DRAWINGS

FIG. 6 is a table for describing a result of heat cycle testing.
FIG. 7 is a cross-sectional view which illustrates an image forming apparatus.
FIGS. 9A and 9B are circuit diagrams which illustrate a booster circuit.
FIG. 13 is a table which describes a test result.
FIGS. 14A and 14B are B-B cross-sectional views of the piezoelectric transformer.

DESCRIPTION OF THE EMBODIMENTS

Embodiments of the present invention are explained below based on the drawings. Note that the embodiments indicated below are examples, and are not intended to limit the technical scope of the invention thereto. Configurations for working the present invention are explained in detail below using the embodiments, while referring to the attached drawings.

[Piezoelectric Transformer]

Figure 1:
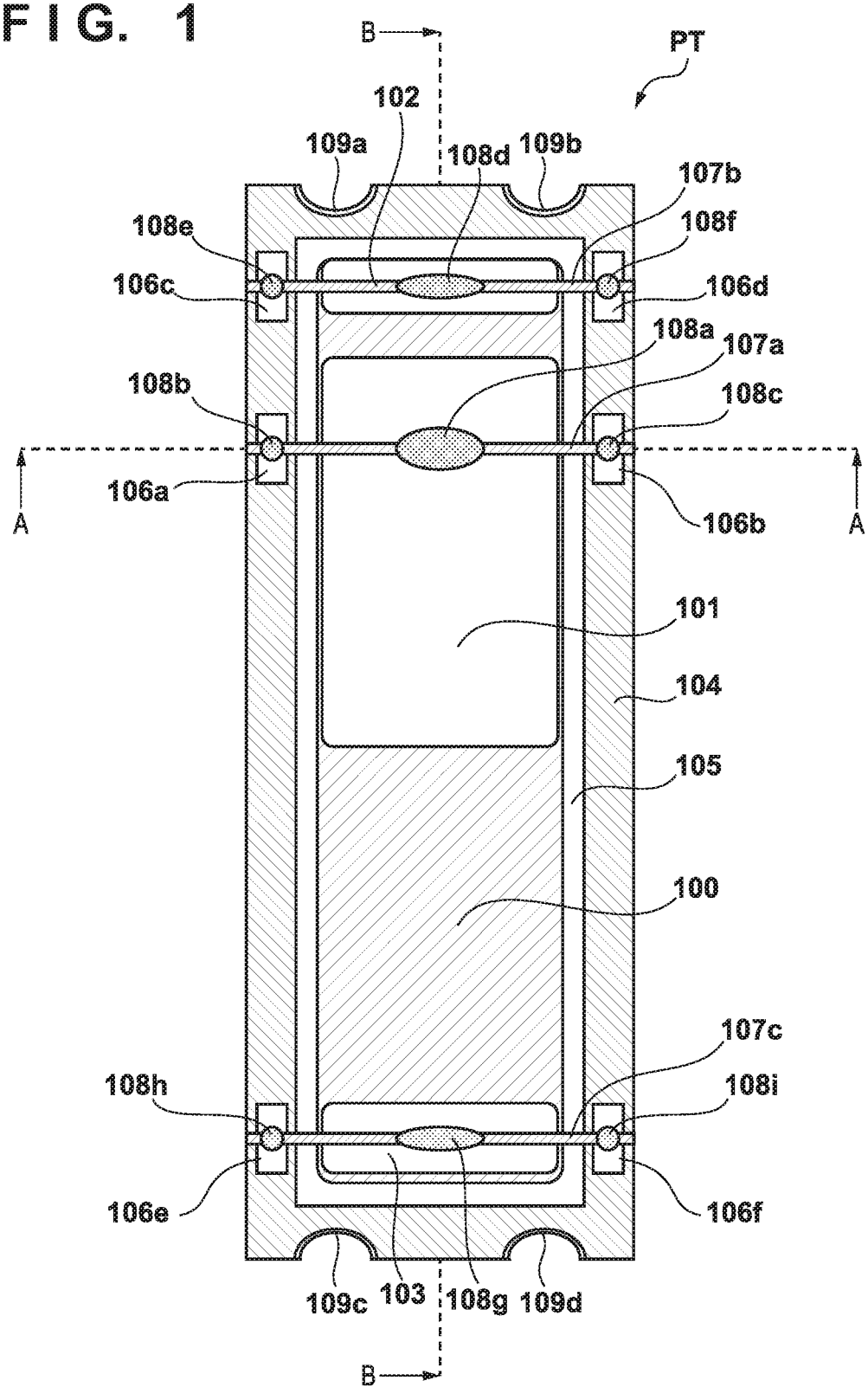
FIG. 1 is a plan view of a piezoelectric transformer.

FIG. 1 is a plan view illustrating a surface-mounted type piezoelectric transformer PT. Surface mounted refers to SMT (Surface Mount Technology), which is a technique for mounting electronic components to a surface of a printed circuit board. In surface mounting, an electronic component is mounted to a printed circuit board using a reflow. Note that a surface-mounted electronic component is referred to as an SMD (Surface Mount Device). A piezoelectric substance 100 is an approximately plate-shaped rectangular parallelepiped, and has six exterior surfaces. In particular, out of two exterior surfaces that form a pair in a thickness direction, one exterior surface is a bottom surface that faces a printed circuit board, and the other exterior surface is a top surface on which a first input electrode 101, a second input electrode 102, and an output electrode 103 are formed. The thickness direction is a normal direction of the top surface and the bottom surface. A frame substrate 104 is a frame-shaped member that is provided so as to surround the four side surfaces of the piezoelectric substance 100. The frame substrate 104 is thicker than the piezoelectric substance 100. In other words, the piezoelectric substance 100 is thinner than the frame substrate 104. A rectangular hole 105 is provided in the center of the frame substrate 104. The piezoelectric substance 100 is accommodated in the hole 105. In a plan view, the area of the rectangular hole 105 is larger than the area of the piezoelectric substance 100. In other words, a length in a shorter side direction of the hole 105 is longer than a length in shorter side direction of the piezoelectric substance 100, and a length in a lengthwise direction of the hole 105 is longer than a length in the lengthwise direction of the piezoelectric substance 100. Accordingly, the four side surfaces of the piezoelectric substance 100 do not contact with interior surfaces of the frame substrate 104. In other words, in a state where the piezoelectric substance 100 is arranged in the hole 105, an appropriate clearance (space) is ensured between an outer circumferential surface of the piezoelectric substance 100 and an inner circumferential surface of the hole 105. With such a configuration, the size and the shape of the hole 105 is a size and shape such that the piezoelectric substance 100 can be arranged in the hole 105. The hole 105 is formed by extending through (opening) a plate-shaped substrate which is the frame substrate 104 in a thickness direction.

The frame substrate 104 has two long portions and two short portions. Substrate electrodes 106a and 106b which are each connected to the first input electrode 101 via a gold line 107a are provided left and right of the first input electrode 101 on top surfaces of long portions of the frame substrate 104. The substrate electrodes 106a and 106b are lands formed as conductive patterns on the top surface of the frame substrate 104. The first input electrode 101 is soldered to the gold line 107a by solder 108a. The substrate electrodes 106a and 106b are respectively soldered to the gold line 107a by solder 108b and 108c.

Substrate electrodes 106c and 106d which are each connected to the second input electrode 102 via a gold line 107b are provided left and right of the second input electrode 102 on the top surface of the frame substrate 104. The substrate electrodes 106c and 106d are lands formed as conductive patterns on the top surface of the frame substrate 104. The second input electrode 102 is soldered to the gold line 107b by solder 108d. The substrate electrodes 106c and 106d are respectively soldered to the gold line 107b by solder 108e and 108f.

Substrate electrodes 106e and 106f which are each connected to the output electrode 103 via a gold line 107c are provided left and right of the output electrode 103 on the top surface of the frame substrate 104. The substrate electrodes 106e and 106f are lands formed as conductive patterns on the top surface of the frame substrate 104. The output electrode 103 is soldered to the gold line 107c by solder 108g. The substrate electrodes 106e and 106f are respectively soldered to the gold line 107c by solder 108h and 108i.

As illustrated in FIG. 1, the gold lines 107a, 107b, and 107c are bridged to the two long portions (a left member and a right member) that configure the frame substrate 104, and support the piezoelectric substance 100 so as to suspend the piezoelectric substance 100.

As illustrated in FIG. 1, external electrodes 109a to 109d are formed on end surfaces of the two short portions that are on both sides of the frame substrate 104 in the lengthwise direction. The external electrodes 109a to 109d are connected to a wiring pattern formed in an inner layer of the frame substrate 104. The external electrode 109a is connected to the substrate electrodes 106c and 106d. The external electrode 109b is connected to the substrate electrodes 106a and 106b. The external electrodes 109c and 109d are connected to the substrate electrodes 106e and 106f. Accordingly, when mounting a piezoelectric transformer PT on a printed circuit board, the external electrodes 109a to 109d are soldered onto lands on the printed circuit board.

Figure 2:
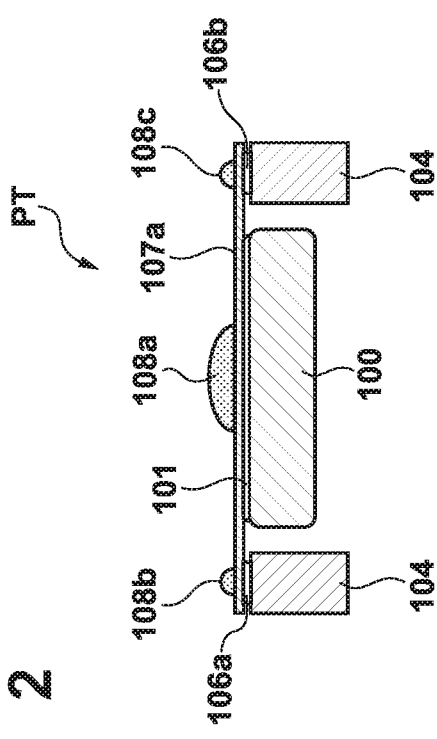
FIG. 2 is an A-A cross-sectional view of the piezoelectric transformer.

FIG. 2 is a cross-sectional view achieved by cutting the piezoelectric transformer PT in FIG. 1 by an A-A cutting line. The frame substrate 104 is thicker than the piezoelectric substance 100. By supporting the piezoelectric substance 100 by only a top surface side of the frame substrate 104, the piezoelectric substance 100 floats above the bottom surface of the frame substrate 104. Accordingly, when the piezoelectric transformer PT is surface-mounted to a printed circuit board with the frame substrate 104 as a base, the bottom surface of the piezoelectric substance 100 will not contact the printed circuit board.

[High-Density Mounting]

Figure 3:
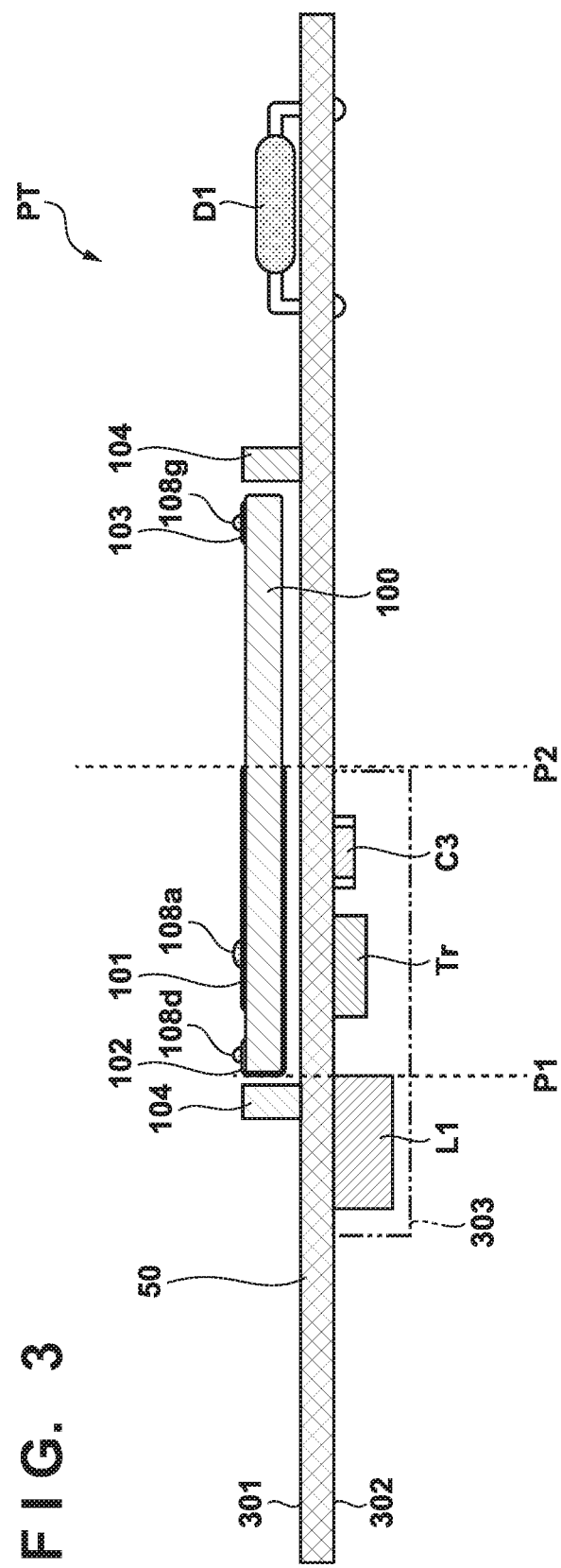
FIG. 3 is a B-B cross-sectional view of the piezoelectric transformer.
Figure 4:
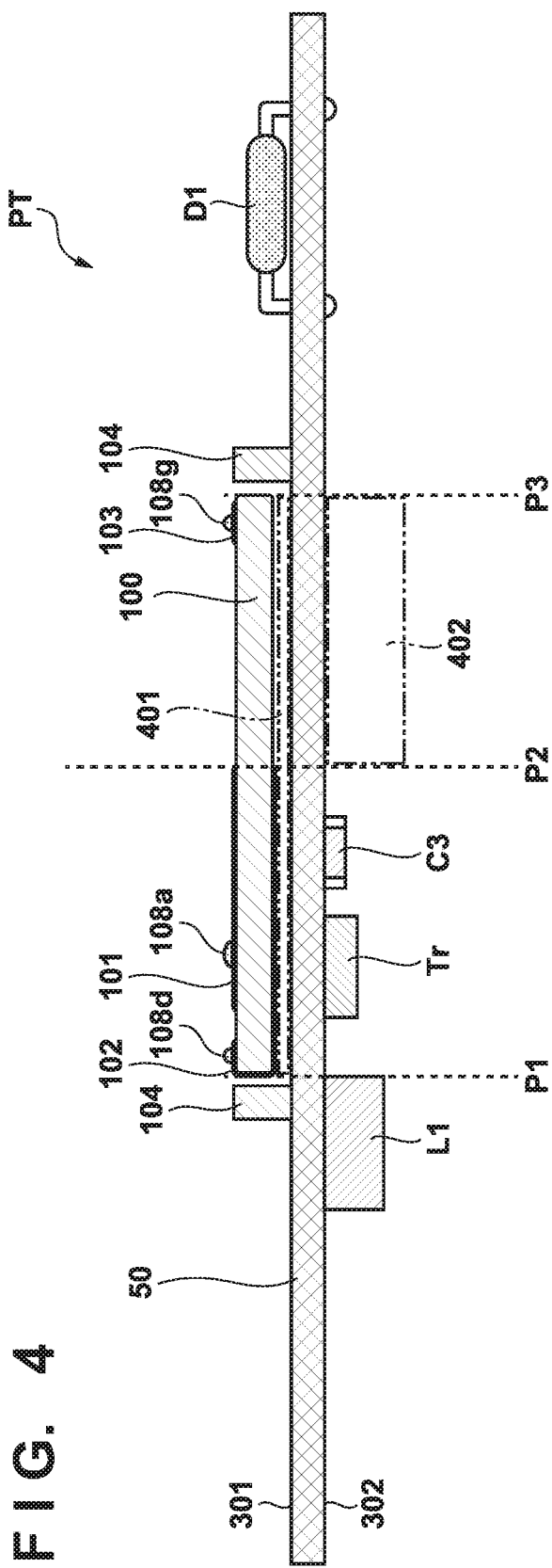
FIG. 4 is a B-B cross-sectional view of the piezoelectric transformer.

Explanation is given for an arrangement of electronic components in a double-sided printing substrate 50, with reference to FIG. 3 and FIG. 4. FIG. 3 and FIG. 4 are cross-sectional views achieved by cutting the piezoelectric transformer PT in FIG. 1 by a B-B cutting line. The double-sided printing substrate 50 has a first mounting surface 301 and a second mounting surface 302 that are each capable of mounting electronic components. The piezoelectric transformer PT is surface-mounted to the first mounting surface 301 by soldering so that the bottom surface of the frame substrate 104 of the piezoelectric transformer PT faces the first mounting surface 301. The piezoelectric substance 100 does not contact the first mounting surface 301 because the bottom surface of the piezoelectric substance 100 floats above the bottom surface of the frame substrate 104. Therefore, the double-sided printing substrate 50 does not inhibit mechanical vibration of the piezoelectric substance 100.

Note that a diode D1 is mounted to the first mounting surface 301. An inductor L1, a field-effect transistor Tr, a capacitor C3, or the like which are parts of a driving circuit for driving the piezoelectric transformer PT are mounted to the second mounting surface 302. Note that the first input electrode 101 has four sides because it is approximately rectangular, but a location of a side closest to the output electrode 103 of these four sides is assumed to be P2. Note that a cross-sectional shape of the second input electrode 102 is approximately U-shaped. In other words, the second input electrode 102 extends over the top surface, a side surface, and the bottom surface of the piezoelectric substance 100. In other words, a portion of the second input electrode 102 arranged on the bottom surface of the piezoelectric substance 100 faces the first input electrode 101 and thereby sandwiches the piezoelectric substance 100. In other words, the first input electrode 101 and the second input electrode 102 form a pair of respective faced electrodes. An electric field occurs inside the piezoelectric substance 100 in accordance with a potential difference between the first input electrode 101 and the second input electrode 102, and a mechanical vibration is generated in the piezoelectric substance 100. The second input electrode 102 extends until the location P2 on the bottom surface of the piezoelectric substance 100. A region of the second mounting surface 302 leftward of the location P2 is a first region 303 on which mounting of electronic components is allowed. In other words, mounting of electronic components is also allowed for at least a region from a location P1 to the location P2 out of the first region 303. The location P1 is the end portion of the second input electrode 102, and is the location of the end portion farthest from the end portion of the output electrode 103.

As illustrated in FIG. 4, a clearance space provided between the piezoelectric substance 100 and the first mounting surface 301 is a second region 401. As illustrated in FIG. 4, the second region 401 is a region from the location P1 to a location P3. The location P3 is a location of an end portion farthest from the first input electrode 101 or the second input electrode 102, out of end portions of the output electrode 103. It is possible to lower a mounting height of the piezoelectric transformer PT, by making the second region 401 be a region in which arrangement of electronic components is prohibited. Note that the height of the second region 401 increases if the thickness if the piezoelectric substance 100 is made sufficiently thicker than the thickness of the frame substrate 104. In other words, it is also possible to mount electronic components to the second region 401 without inhibiting mechanical vibration by the piezoelectric substance 100. This may be employed when there is leeway in the mounting height of the piezoelectric transformer PT and a cost increase for the piezoelectric transformer PT due to increasing the thickness of the frame substrate 104 is acceptable. For example, there may be a case where an SMD such as a chip resistor, a chip condenser, or a field-effect transistor (FET) can be mounted.

As described above, the first region 303, to which electronic components can be mounted, is provided leftward of the location P2 on the second mounting surface 302. As illustrated by FIG. 4, a third region 402, in which mounting of electronic components is prohibited, is provided rightward of the location P2 on the second mounting surface 302. The third region 402 is a region from the location P2 to the location P3. For the piezoelectric transformer PT to output a high voltage, a voltage of 200 [V] or less, for example, is applied from the driving circuit configured from the field-effect transistor Tr, the inductor L1, the capacitor C3, and the like to the first input electrode 101 and the second input electrode 102. In testing by the inventors, no degradation of the performance of electronic components mounted to the first region 303 was found. In other words, it was found that capacitive coupling between the piezoelectric transformer PT and these electronic components is sufficiently small. In contrast, the third region 402 is a region that faces a segment of the piezoelectric substance 100 that uses mechanical vibration to gradually boost the voltage inputted from the driving circuit. When the driving circuit was arranged on the third region 402, it was confirmed that capacitive coupling between the driving circuit and the piezoelectric transformer PT could not be ignored. In addition, it was also confirmed that an electric field occurring due to the piezoelectric effect by the piezoelectric transformer PT influenced the driving circuit arranged in the third region 402.

Accordingly, by allocating the first region 303 in the second mounting surface 302 and mounting the driving circuit for driving the piezoelectric transformer PT to the first region 303, it is possible to effectively use the second mounting surface 302. In other words, high-density mounting is realized. In comparison to a resin-case type piezoelectric transformer, the piezoelectric transformer PT of the present embodiment is flow mounted as thus does not need a dead space. In other words, it is possible to mount electronic components to this dead space, and advantageous in miniaturization of the circuit area.

Figure 5:
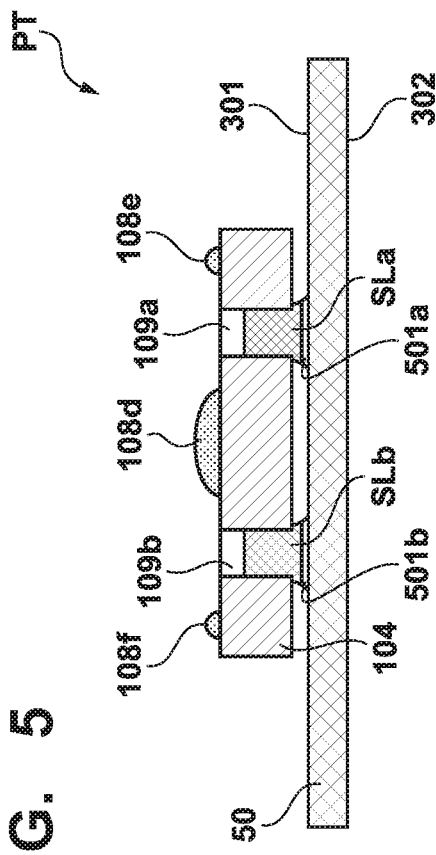
FIG. 5 is a side view of the piezoelectric transformer.

FIG. 5 is a side view of a short side of the piezoelectric transformer PT seen from an input electrode. With reference to FIG. 5, explanation is given for soldering portions of the piezoelectric transformer PT which is surface-mounted to the double-sided printing substrate 50.

[Solder Mounting]

The double-sided printing substrate 50 is a printed circuit board in which metal wiring is formed on both sides: the first mounting surface 301 and the second mounting surface 302 which are of a substrate (for example: made of a glass epoxy resin) referred to as a core. Metal wiring may also be formed inside the substrate in addition to on the first mounting surface 301 and the second mounting surface 302 which are principal surfaces of the substrate.

Wiring provided on a top surface of the double-sided printing substrate 50 includes four lands that are electrically connected to the external electrodes 109a to 109d. In FIG. 5, lands 501a and 501b that are respectively connected to the external electrodes 109a and 109b of an input side are illustrated. The side surface for the external electrodes 109c and 109d of an output side is a similar configuration to that of the external electrodes 109a and 109b of the input side, and thus illustration thereof is omitted.

As illustrated in FIG. 5, the external electrode 109a is soldered to the land 501a via a conductive jointing material SLa. Similarly, the external electrode 109b is soldered to the land 501b via a conductive jointing material SLb. The conductive jointing material SLa and the conductive jointing material SLb are solder of a type that melts in a reflow oven. The conductive jointing material SLa and the conductive jointing material SLb may be an alloy of tin and lead for example, and may be an alloy that does not use lead.

[Cracking Due to Differences in Coefficients of Thermal Expansion Between Substrates]

Cracking or the like may occur in the conductive jointing material SLa and SLb, due to a temperature change of the environment in which a power supply apparatus having the double-sided printing substrate 50 and the piezoelectric transformer PT is installed. This is because of stress due to a difference between the coefficient of thermal expansion of the double-sided printing substrate 50 and the coefficient of thermal expansion of the frame substrate 104 of the piezoelectric transformer PT on the conductive jointing material SLa and SLb. Accordingly, the inventors performed heat cycle testing to confirm the existence or absence of cracks in soldered portions.

[Coefficient of Thermal Expansion of Substrate]

The printed circuit board expands or shrinks in accordance with heat. The coefficient of thermal expansion of the substrate differs in accordance with the type of the substrate or the orientation of glass fibers. CEM-3 and FR-4, which are general-purpose materials, were selected for the double-sided printing substrate 50 and the material of the frame substrate 104 of the piezoelectric transformer PT. CEM-3 has a coefficient of thermal expansion in a longitudinal direction of 20 to 25 ppm/° C., and a coefficient of thermal expansion in a horizontal direction of 23 to 28 ppm/° C. FR-4 has a coefficient of thermal expansion in a longitudinal direction of 10 to 14 ppm/° C., and a coefficient of thermal expansion in a horizontal direction of 12 to 16 ppm/° C. ppm is an abbreviation of parts per million, and means $10^{-6}$.

[Heat Cycle Testing]

In the heat cycle testing, the double-sided printing substrate 50 on which the piezoelectric transformer PT was mounted was arranged in a thermostatic bath. Conditions of the heat cycle testing were set in accordance with the test conditions recited in ET-7404A "Environmental and endurance test methods for CSP/BGA package on mounting condition" which is a JEITA standard. JEITA is an abbreviation of Japan Electronics and Information Technology Industries Association. Here, usage conditions (power off, standby, operation) of an image forming apparatus in which a high voltage power supply that employs the piezoelectric transformer PT is mounted are considered. A maximum temperature is 125° C. A minimum temperature is −25° C. A temperature holding period (an amount of time until the double-sided printing substrate 50 on which the piezoelectric transformer PT is mounted acclimatizes to the environment of the thermostatic bath is 30 minutes. One cycle is a course of transitioning from 125° C. to −25° C., and then returning to 125° C. 800 cycles are executed as heat cycle testing.

[Test Results]

FIG. 6 is a table that illustrates combinations of the double-sided printing substrate 50 and the frame substrate 104. Numbers indicate differences in the coefficient of thermal expansion. A portion surrounded by a thick frame in FIG. 6 indicates combinations for which a test was actually performed. Diagonal lines indicate combinations for which cracks occurred. In order to confirm the reliability of a soldered portion of the piezoelectric transformer PT which was surface-mounted to the double-sided printing substrate 50, the heat cycle testing was performed for various combinations of the type of substrate and the orientation of fibers. The inventors confirmed the existence or absence of cracks in soldered portions after the heat cycle testing completed. As indicated by the bold-line frame, in order to improve test efficiency, selection of the substrate for the double-sided printing substrate 50 is fixed to FR-4, and the orientation of fibers is fixed to a longitudinal direction. In contrast, combinations of the orientation and the substrate of the frame substrate 104 that were combined with the double-sided printing substrate 50 were variously changed. Soldered portions of the piezoelectric transformer PT which was surface-mounted to the double-sided printing substrate 50 were subject to cross-sectional polishing, and the existence or absence of cracks in the polished portion was confirmed through a microscope.

As indicated by FIG. 6, when CEM-3 was employed as the substrate of the frame substrate 104, cracking occurs with no dependence on the orientation of the fibers. When focus is given to differences in coefficients of thermal expansion with the double-sided printing substrate 50, it was ascertained that cracking occurred with combinations having a difference of 6 ppm/° C. or more. In other words, it is understood that the occurrence of cracking is reduced or avoided if the difference in the coefficient of thermal expansion between the double-sided printing substrate 50 and the frame substrate 104 is less than 6 ppm/° C.

Conditions employed in heat cycle testing are not limited to the foregoing example. The conditions may be changed in accordance with capabilities or the like of the thermostatic bath or an envisioned usage for a test subject. Regarding coefficients of thermal expansion recited in the present embodiment, focus was given to coefficients in the longitudinal direction and coefficients in the horizontal direction. Regarding thickness directions, a difference in coefficients of thermal expansion between substrates is set to a level that is unlikely to cause cracking.

[Image Forming Apparatus]

FIG. 7 illustrates an image forming apparatus 1 of the intermediate transfer method that is capable of applying a power supply apparatus that uses a piezoelectric transformer. The image forming apparatus 1 may be an image forming apparatus for forming a monochrome image, but here is an electrophotographic type image forming apparatus that forms a multicolor image by color mixing of a plurality of colorants. The image forming apparatus 1 uses toner of four colors such as yellow (Y), magenta (M), cyan (C), and black. Characters indicating a color are added to the end of reference numerals in FIG. 7, but these characters are omitted when matters common to the four colors are explained.

Photosensitive drums 6C, 6M, 6Y, and 6BK are arranged at regular intervals to each other, and are image carriers for carrying an electrostatic latent image or a toner image. An engine controller 20 controls a high voltage power supply 30 to generate a charging voltage, and supplies the charging voltage to a primary charger 2. The primary charger 2 uses the charging voltage to uniformly charge a surface of a photosensitive drum 6. An optical scanning apparatus 3 emits toward the photosensitive drum 6 a light beam (a laser beam) L that is respectively modulated based on an input image. The light beam (laser beam) L forms an electrostatic latent image on the surface of the photosensitive drum 6. The engine controller 20 controls the high voltage power supply 30 to generate a developing voltage, and supplies the developing voltage to a developer 4. The developer 4 causes cyan, magenta, yellow, and black toner to adhere to the electrostatic latent image, via a sleeve or a blade to which the developing voltage is respectively is applied. By this, the electrostatic latent image is developed and a developer image (a toner image) is formed.

A sheet feed roller 8 one at a time feeds a sheet P accommodated in a feeding tray 7. A registration roller 9 feeds the sheet P synchronized to a write start timing of an image toward a secondary transfer unit.

The engine controller 20 controls the high voltage power supply 30 to generate a primary transfer voltage, and supplies the primary transfer voltage to a primary transfer roller 5. The primary transfer roller 5 primary transfers the toner image carried by the photosensitive drum 6 onto an intermediate transfer belt 10. The primary transfer voltage applied to the primary transfer roller 5 promotes the primary transfer of the toner image. The intermediate transfer belt 10 functions as an intermediate transfer body. A driving roller 11 is a roller that causes the intermediate transfer belt 10 to rotate. A secondary transfer unit has a secondary transfer roller 14. The engine controller 20 controls the high voltage power supply 30 to generate a secondary transfer voltage, and supplies the secondary transfer voltage to the secondary transfer roller 14. In the secondary transfer unit, by the intermediate transfer belt 10 and the secondary transfer roller 14 conveying while pinching the sheet P, the multicolor toner image carried on the intermediate transfer belt 10 is secondary transferred to the sheet P. The secondary transfer voltage promotes the secondary transfer. After this, the sheet P is conveyed to a fixing device 12. The fixing device 12 applies heat and pressure to the toner image carried on the sheet P to cause fixing. A discharging roller 13 discharges the sheet P on which the image is formed.

[Configuration of High Voltage Power Supply]

Figure 8:
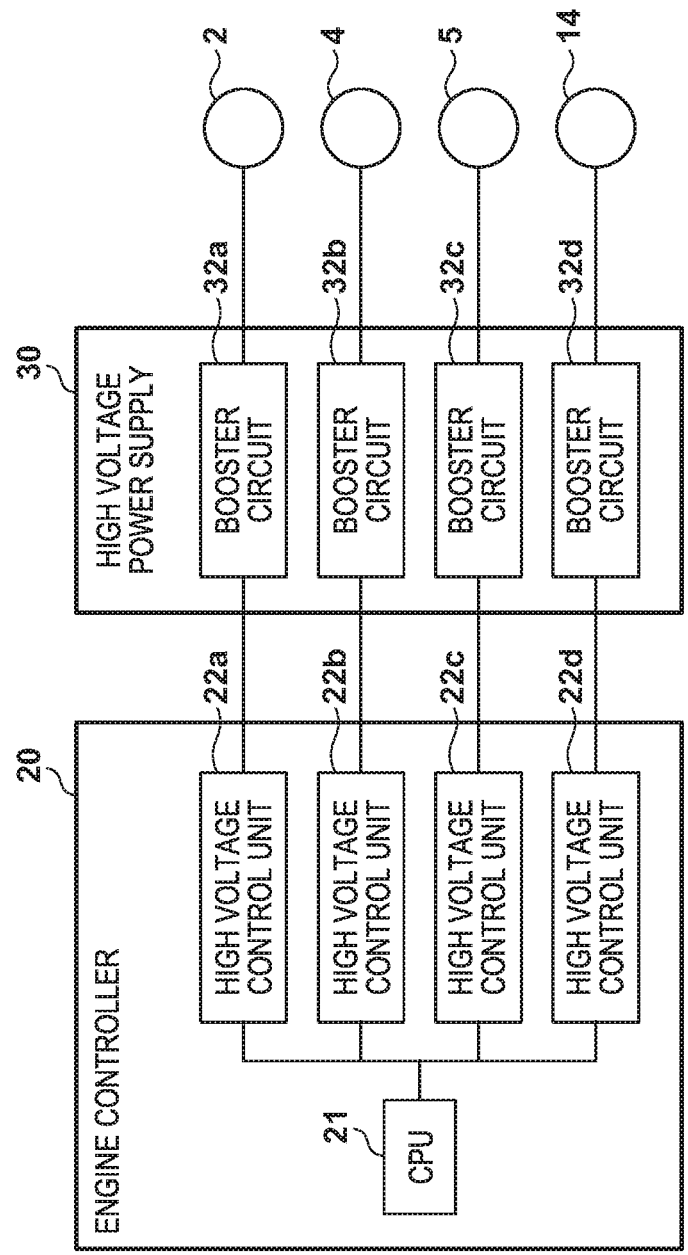
FIG. 8 is a view which illustrates an engine controller and a high voltage power supply.

FIG. 8 is a view for explaining the engine controller 20 and the high voltage power supply 30. The engine controller 20 has a CPU 21 and high voltage control units 22a through 22d. The CPU 21 sets a target voltage for the charging voltage to the high voltage control unit 22a. The CPU 21 sets a target voltage for the developing voltage to the high voltage control unit 22b. The CPU 21 sets a target voltage for the primary transfer voltage to the high voltage control unit 22c. The CPU 21 sets a target voltage for the secondary transfer voltage to the high voltage control unit 22d. The high voltage power supply 30 has a plurality of power supply circuits. The high voltage power supply 30 has a booster circuit 32a for generating the charging voltage, a booster circuit 32b for generating the developing voltage, a booster circuit 32c for generating the primary transfer voltage, and a booster circuit 32d for generating the secondary transfer voltage. The high voltage control unit 22a controls the booster circuit 32a by outputting a control signal Vcont so that the charging voltage outputted by the booster circuit 32a becomes the target voltage. The high voltage control unit 22b controls the booster circuit 32b by outputting a control signal Vcont so that the developing voltage outputted by the booster circuit 32b becomes the target voltage. The high voltage control unit 22c controls the booster circuit 32c by outputting a control signal Vcont so that the primary transfer voltage outputted by the booster circuit 32c becomes the target voltage. The high voltage control unit 22d controls the booster circuit 32d by outputting a control signal Vcont so that the secondary transfer voltage outputted by the booster circuit 32d becomes the target voltage.

[Circuit Configuration of High Voltage Power Supply]

Using FIG. 9A, explanation is given regarding a booster circuit 32, which is an example of a power supply circuit. In the booster circuit 32, the piezoelectric transformer PT is employed in place of a conventional wire wound type electromagnetic transformer. Output of a secondary side terminal the piezoelectric transformer PT is rectified and smoothed to a positive voltage by a rectification smoothing circuit. The rectification smoothing circuit is configured by a high-voltage capacitor C1 and diodes D1 and D2 for rectification. The output voltage of the piezoelectric transformer PT is output from an output terminal 117 connected to a path stretching from the piezoelectric transformer PT, and is supplied to a load such as the primary transfer roller 5 described above. The output voltage is divided by resistors R1, R1, and R3, and is inputted to a non-inverting input terminal (a positive terminal) of an operational amplifier OP via a resistor R4 for protection and a capacitor C2.

In contrast, the control signal Vcont which is inputted from an input terminal 118 is inputted to the inverting input terminal (a negative terminal) of the operational amplifier OP via a resistor R5. The operational amplifier OP, the resistor R5, and the capacitor C3 function as an integrating circuit. In other words, the control signal Vcont, which is smoothed in accordance with an integration time constant that is decided in accordance with component constants of the resistor R5 and the capacitor C3, is inputted to the operational amplifier OP. The output terminal of the operational amplifier OP is connected to a voltage controlled oscillator (VCO) 119. The voltage controlled oscillator 119 is an example of an oscillator for variably setting a frequency of an output signal in accordance with an inputted control signal.

In addition, the output terminal of the voltage controlled oscillator 119 is connected to the gate of the field-effect transistor Tr. The field-effect transistor Tr is a switching element that is driven by the output signal from the oscillator, and is an example of a semiconductor component for driving a piezoelectric element. The drain of the field-effect transistor Tr is connected to a power supply Vcc (for example: +24V or the like) via the inductor L1, and is also grounded via a capacitor C4. The inductor L1 is an element connected between the switching element and a power supply, and is an example of an element having an inductance component to which a voltage is applied intermittently in accordance with driving of the switching element. Furthermore, the drain is connected to one primary side electrode of the piezoelectric transformer PT. The other primary side electrode of the piezoelectric transformer PT is grounded. In addition, the source of the field-effect transistor Tr is also grounded.

The voltage controlled oscillator 119 switches the field-effect transistor Tr by a frequency in accordance with the output voltage of the operational amplifier OP. The inductor L1 and the capacitor C4 form a resonance circuit. A voltage amplified by the resonance circuit is supplied to the primary side of the piezoelectric transformer PT. In this way, the piezoelectric transformer PT is connected to a connection point between a switching element and an element having an inductance component, and, when a signal that oscillates by a predetermined resonance frequency is applied, outputs a voltage in accordance with a frequency characteristic thereof.

Incidentally, a piezoelectric transformer contributes to miniaturization of a power supply apparatus by being used instead of electromagnetic transformer. As a method for mounting a piezoelectric transformer to a printed circuit board, a flow method is common. In the flow method, the piezoelectric transformer is placed on a printed circuit board, and soldered by passing through a high-temperature solder jet flow. Incidentally, a piezoelectric transformer generates a high voltage in accordance with a pyroelectric effect when heated. This high voltage may destroy, for example, other semiconductor components placed on the printed circuit board. Japanese Patent Laid-Open No. 2008-193804 recites reducing an influence of a pyroelectric voltage by making a mount location of a piezoelectric transformer be a location rearward of the mount location of a semiconductor component in a conveyance direction of a printed circuit board. Japanese Patent Laid-Open No. 2013-33929 recites reducing an influence of a pyroelectric voltage by forming a resistor in accordance with conductive coating between two primary side electrodes of a piezoelectric transformer.

As indicated by Japanese Patent Laid-Open No. 2016-76577, making a piezoelectric element be a surface mount component (SMD) is progressing. A reflow method exists as a method for surface-mounting an SMD to a printed circuit board. In the reflow method, the entirety of a printed circuit board passes through a high-temperature space, differing to the flow method. Accordingly, sufficiently suppressing the pyroelectric voltage of a piezoelectric element is difficult in a conventional method. Accordingly, the present embodiment protects a semiconductor component from a pyroelectric voltage generated on a primary side of a piezoelectric element surface-mounted to a printed circuit board by the reflow method.

[Pyroelectric Effect of Piezoelectric Transformer in Reflow Oven]

A process when surface-mounting the piezoelectric transformer PT to the double-sided printing substrate 50 is as follows. Cream solder is applied onto a land formed on the double-sided printing substrate 50 via a metal mask. Cream solder may be referred to as solder paste. The piezoelectric transformer PT is mounted to a mount location on the double-sided printing substrate 50. The cream solder melts and soldering is performed by the double-sided printing substrate 50 to which the piezoelectric transformer PT is mounted passing through a reflow oven.

Figure 10:
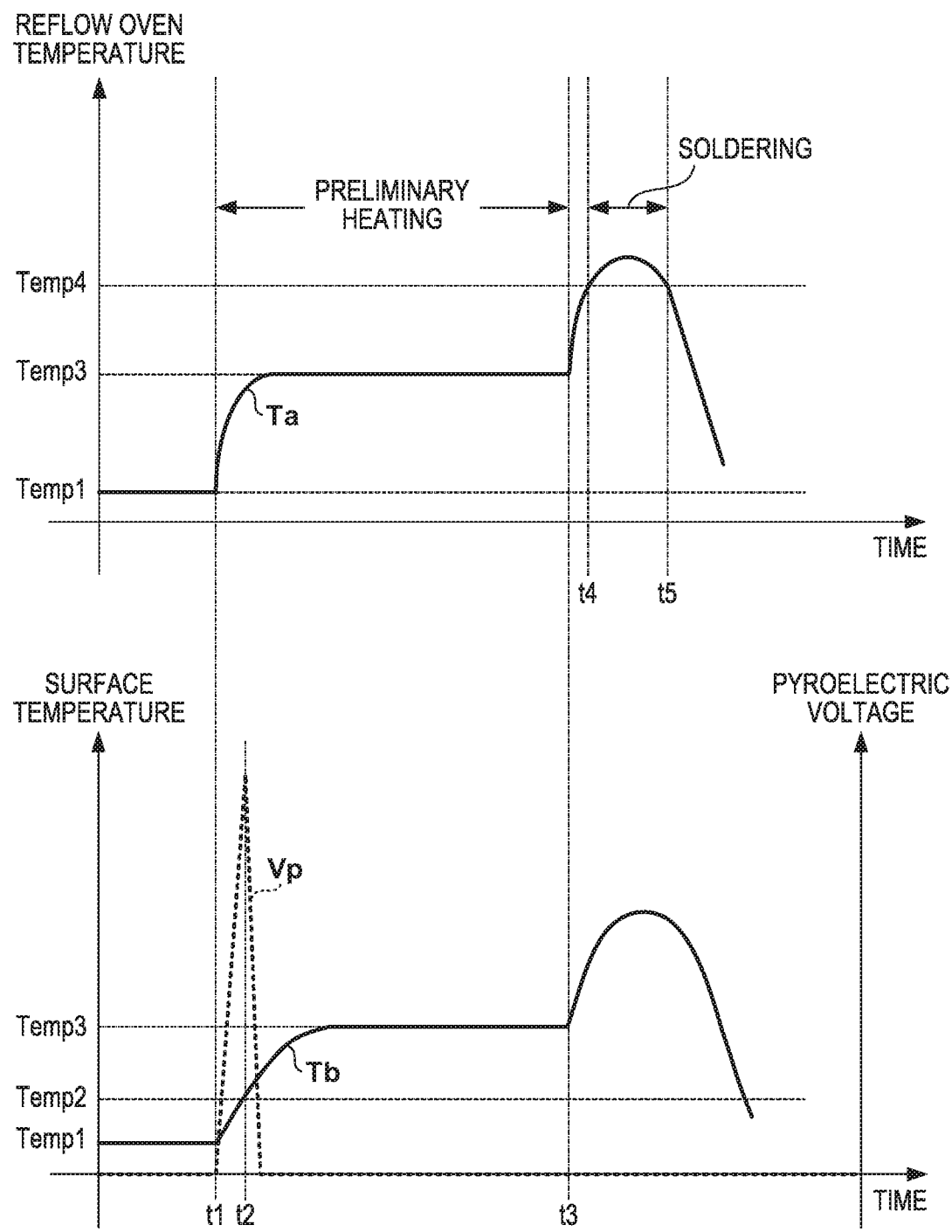
FIG. 10 is a view which illustrates a relationship between reflow oven temperature, surface temperature of a piezoelectric substance, and pyroelectric voltage.

FIG. 10 illustrates relations between a pyroelectric voltage Vp and a surface temperature Tb of the piezoelectric transformer PT, and a reflow oven temperature Ta, in a period from when the double-sided printing substrate 50 is loaded into the reflow oven until it is discharged. The pyroelectric voltage is a voltage occurring in the piezoelectric transformer PT in accordance with the pyroelectric effect.

The processing for passing through the reflow oven has a preliminary heating step and a soldering step. A step from a time t1 to a time t3 is the preliminary heating step. A step from a time t4 to a time t5 is the soldering step. In the preliminary heating step, the reflow oven temperature Ta rises to Temp3 from a room temperature Temp1 in a factory where the reflow oven is installed. Temp3 is 150° C. to 180° C., for example. Consequently, flux contained in the cream solder is heated and activates, and the surfaces of the lands 501 provided on the double-sided printing substrate 50 and the surfaces of the external electrodes 109 of the piezoelectric transformer PT are cleaned so that an oxide layer or the like is removed. To improve the accuracy of the cleaning, the preliminary heating step is continued for a predetermined period. Subsequently, in order to solder the double-sided printing substrate 50 and the piezoelectric transformer PT, for the reflow oven, the temperature in the oven is caused to increase to be greater than or equal to a melting point Temp4 of the solder. This is because there is a necessity for soldered electronic components to be sufficiently heated. The melting point Temp4 is 230° C., for example, but this depends on components of the cream solder.

The double-sided printing substrate 50 after being discharged from the reflow oven cools in accordance with natural heat dissipation or the like, and the melted solder cures. By this, the lands and the electronic components are reliably electrically connected. In this way, the reflow method differs from the flow method, and the entirety of the double-sided printing substrate 50 passes through the inside of the reflow oven, and the entirely of the double-sided printing substrate 50 is heated at once. Accordingly, it is not possible to define an order in which electronic components are soldered by a mount location in a conveyance direction inside a reflow oven.

A conveyance speed at which the double-sided printing substrate 50 is conveyed in the reflow oven is adjusted so that a temperature gradient of the ambient temperature of the double-sided printing substrate 50 in the reflow oven becomes 5° C./sec or smaller. As illustrated in FIG. 1 or the like, a large portion of the piezoelectric substance 100 of the piezoelectric transformer PT which is a surface-mounted type is exposed externally. Accordingly, the surface temperature of the piezoelectric substance 100 increases so as to track the temperature profile of the reflow oven.

Using FIG. 10, explanation is given for a pyroelectric voltage Vp arising in the piezoelectric transformer PT. The piezoelectric transformer PT is mounted onto cream solder applied on the lands of the double-sided printing substrate 50, but at this point in time the piezoelectric transformer PT and the lands 501 are not electrically connected. This is because an oxide film that impedes electrical conductivity is present on respective surfaces of the lands 501, the external electrodes 109, and the cream solder. As described above, oxide films are removed by flux contained in the cream solder. A temperature Temp2 at which flux activates (achieves efficacy for removing oxide films) is approximately 100° C. or more. In FIG. 10, the surface temperature of the piezoelectric substance 100 reaches Temp2 at the time t2. In other words, in the preliminary heating step, in a segment from the time t1 to the time t2, the piezoelectric transformer PT and the double-sided printing substrate 50 are not electrically connected. Accordingly, when no countermeasure is performed, the pyroelectric voltage Vp becomes a high voltage as illustrated by the dashed line of FIG. 10. As a result, there is a possibility for a spark discharge to be generated in the gap occurring between the external electrodes 109 of the piezoelectric transformer PT and the lands 501 of the double-sided printing substrate 50, precipitating an electrostatic withstand voltage breakdown for the semiconductor component.

[Method of Reducing Pyroelectric Voltage and Effect Thereof]

FIG. 9B illustrates a booster circuit 32 in which a pyroelectric countermeasure has been embedded. Note that the same reference numerals are added to electronic components that have been already explained, and the explanation thereof is invoked. As illustrated in FIG. 9B, resistors R6 and R7 are connected in parallel to the primary electrode pair of the piezoelectric transformer PT. The primary electrode pair is a pair formed by the first input electrode 101 and the second input electrode 102. In other words, one terminal of the resistor R6 is connected to the first input electrode 101, and the other terminal of the resistor R6 is connected to the second input electrode 102. Similarly, one terminal of the resistor R7 is connected to the first input electrode 101, and the other terminal of the resistor R7 is connected to the second input electrode 102. Note that the resistor R6 is an example of a first resistor. The resistor R7 is an example of a second resistor.

Because the double-sided printing substrate 50 has the first mounting surface 301 and the second mounting surface 302, it is loaded into the reflow oven twice. Accordingly, in the present embodiment, the mounting order is contrived so that the piezoelectric transformer PT and a semiconductor component are protected from a pyroelectric voltage (represented here by the transistor Tr). In other words, the mounting surface on which the piezoelectric transformer PT is mounted differs from mounting surface on which the semiconductor component is mounted.

The role of the resistors R6 and R7 is for the discharge of a pyroelectric current occurring in the piezoelectric substance 100 due to the pyroelectric effect in the reflow. By this, it becomes less likely for the pyroelectric voltage to be applied to the semiconductor component, and thus electrostatic withstand voltage breakdown becomes less likely to occur.

Figure 11:
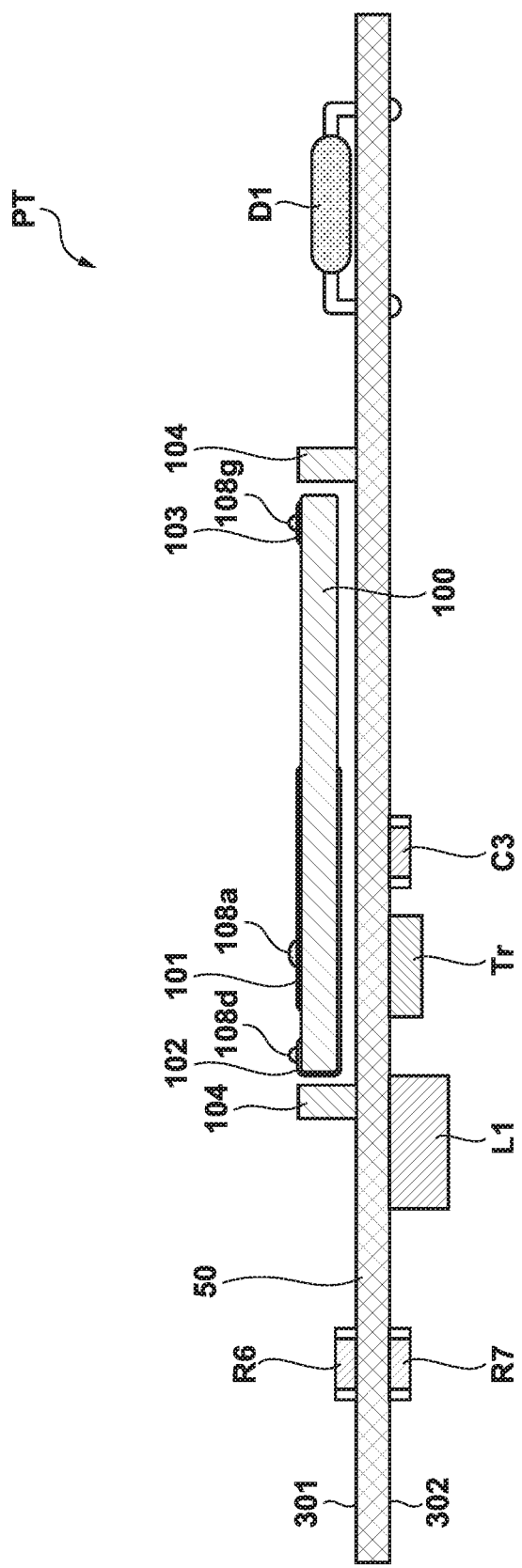
FIG. 11 is a B-B cross-sectional view of the piezoelectric transformer.

FIG. 11 is a cross-sectional view illustrating the double-sided printing substrate 50 to which electronic components are mounted. This cross section is a cross section formed by the B-B cutting line in FIG. 1. As illustrated by FIG. 11, the piezoelectric transformer PT is mounted to the first mounting surface 301, but the transistor Tr which is a protection target is arranged on the second mounting surface. In addition, the resistor R6 which is connected in parallel to the primary electrode pair is mounted to the first mounting surface 301. The resistor R7 which is connected in parallel to the primary electrode pair is mounted to the second mounting surface 302.

Figure 12:
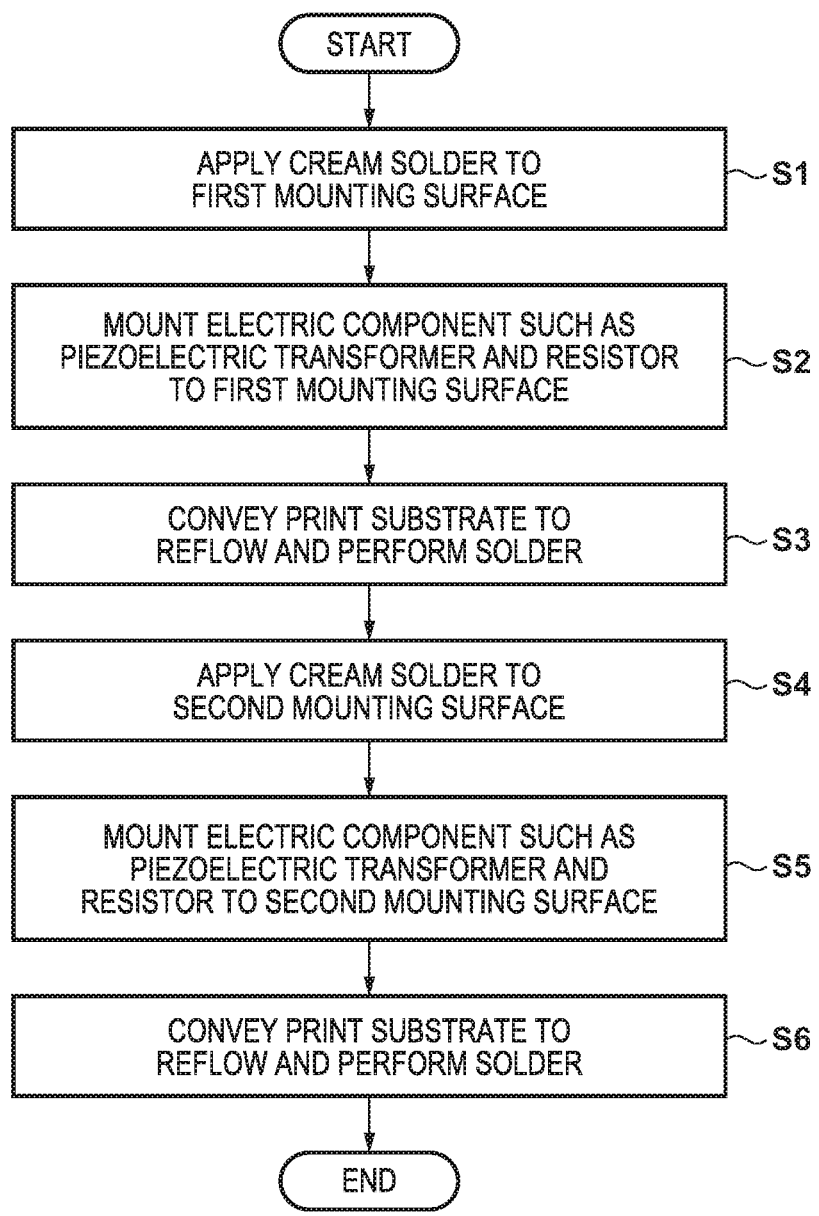
FIG. 12 is a flowchart which describes each step of a reflow.

FIG. 12 is a flowchart which describes each step of a reflow. When the first reflow is started, in step S1, cream solder is applied to the first mounting surface 301 of the double-sided printing substrate 50. Next, in step S2, the piezoelectric transformer PT which is of a surface-mounted type, and the resistor R6 which is connected in parallel to the primary electrode pair of the piezoelectric transformer PT are mounted to the first mounting surface 301. In step S3, the double-sided printing substrate 50 is inserted into the reflow oven, and the piezoelectric transformer PT and the resistor R6 are soldered to the first mounting surface 301. In this way, in the first reflow, various electronic components including the piezoelectric transformer PT and the resistor R6 are mounted to the first mounting surface 301. A pyroelectric voltage is generated in the piezoelectric transformer PT during the first reflow, but because the transistor Tr is not present on the first mounting surface 301, the transistor Tr is not affected by the pyroelectric voltage.

When the second reflow is started, in step S4, cream solder is applied to the second mounting surface 302 of the double-sided printing substrate 50. Next, in step S5, the transistor Tr which forms a driving circuit for driving the piezoelectric transformer PT is mounted to the second mounting surface 302. In addition, other electronic components such as the resistor R7 are mounted. In step S6, the double-sided printing substrate 50 is inserted into the reflow oven, and the transistor Tr or the resistor R7 are soldered to the second mounting surface 302.

Because the first mounting surface 301 also passes through a high-temperature space in the second reflow similarly to in the first time, a pyroelectric voltage is generated in the piezoelectric transformer PT. The piezoelectric transformer PT and the resistor R6 are already soldered to the double-sided printing substrate 50 by the first reflow. In other words, because the primary electrode pair of the piezoelectric transformer PT forms a closed loop via the resistor R6, the pyroelectric current flows through the resistor R6, and is converted to heat thereby. Accordingly, electrostatic withstand voltage breakdown of the transistor Tr is suppressed.

Incidentally, configuration may be taken such that electronic components are mounted to the second mounting surface 302 in the first reflow, and electronic components are mounted to the first mounting surface 301 in the second reflow. When the first reflow is started, cream solder is applied to the second mounting surface 302 of the double-sided printing substrate 50. Next, the transistor Tr which forms a driving circuit for driving the piezoelectric transformer PT is mounted to the second mounting surface 302. In addition, other electronic components such as the resistor R7 are mounted. The double-sided printing substrate 50 is inserted into the reflow oven, and the transistor Tr or the resistor R7 are soldered to the second mounting surface 302.

When the second reflow is started, firstly cream solder is applied to the first mounting surface 301 of the double-sided printing substrate 50. Next, the piezoelectric transformer PT which is of a surface-mounted type, and the resistor R6 which is connected in parallel to the primary electrode pair of the piezoelectric transformer PT are mounted to the first mounting surface 301. The double-sided printing substrate 50 is inserted into the reflow oven, and the piezoelectric transformer PT and the resistor R6 are soldered to the first mounting surface 301. In this way, in the second reflow, various electronic components including the piezoelectric transformer PT and the resistor R6 are mounted to the first mounting surface 301. A pyroelectric voltage is generated in the piezoelectric transformer PT in the second reflow, but because the transistor Tr and the resistor R7 are soldered by the first reflow, the pyroelectric current flows through the resistor R7 and is converted to heat. In this way, in a case where electronic components are mounted to the second mounting surface 302 before the first mounting surface 301, electrostatic withstand voltage breakdown of the transistor Tr is suppressed by the resistor R7.

In this way, when the first mounting surface 301 passes through the reflow oven first the resistor R6 reduces the pyroelectric current, and when the second mounting surface 302 passes through the reflow oven first the resistor R7 reduces the pyroelectric current. When it is unknown which mounting surface will pass through reflow first, semiconductor components are reliably protected by mounting both of the resistors R6 and R7. In addition, when a mounting surface that will be loaded into a reflow oven first is confirmed, it should be sufficient if a resistor, out of the resistors R6 and R7, is mounted to the mounting surface that will be loaded into the reflow oven first.

[Resistances of Resistors]

Resistances of the resistors R6 and R7 are decided so as to satisfy two conditions. The first condition is achieving a pyroelectric countermeasure by just one resistor out of the resistors R6 and R7. The greater the resistance the harder it will be for a pyroelectric current to flow to the resistors R6 and R7, and more pyroelectric current will flow to semiconductor components. Accordingly, resistances of the resistors R6 and R7 must be small to a level where semiconductor components are not subject to electrostatic withstand voltage breakdown.

The second condition is making the driving circuit be able to drive the piezoelectric transformer PT so that power supply performance of the power supply circuit satisfies a defined performance. As illustrated by FIG. 9B, the driving circuit has the transistor Tr and an LC parallel resonance circuit formed by the capacitor C3 and the inductor L1. In addition, the resistors R6 and R7 are connected in parallel to the primary electrode pair of the piezoelectric transformer PT. Accordingly, when the resistances of the resistors R6 and R7 are too small, power loss in the resistors R6 and R7 increases, and the power supply performance of the power supply circuit ceases to satisfy the defined performance (an output characteristic or the like).

FIG. 13 is a table that illustrates test results performed in order to decide resistances of the resistors R6 and R7 for satisfying both of the two conditions. ○ indicates satisfactory. Δ indicates insufficient. x indicates unsuitable. The inductance of the inductor L1 is 150 [μH]. The capacitance of the capacitor C3 is 470 [pF]. The resonance frequency of the piezoelectric transformer PT is 140 [kHz]. In the tests, the first mounting surface 301 was subject to a reflow before the second mounting surface 302.

As illustrated by FIG. 13, a resistance at which the resistors R6 and R7 can independently achieve a pyroelectric countermeasure is 3 [MΩ] or less. It was found that an influence on the driving performance of the piezoelectric transformer PT was smaller if a combined resistance of the resistors R6 and R7 was 6.0 [kΩ] or more. Note that, in a case where only one of the resistors R6 and R7 is used, it is sufficient if the resistance of that resistor is 6.0 [kΩ] or more.

In this way, the resistance of the resistors R6 and R7 are decided to be greater than or equal to 6.0 [kΩ] (or 12.0 [kΩ]) and less than or equal to 3.0 [MΩ]. However, resistors have individual differences. In other words, there is variation for resistances. Accordingly, in addition to the test results, when consideration is given to variation of resistances, it is considered appropriate that the resistance of the resistors R6 and R7 be approximately 1.0 [MΩ].

In this way, by virtue of this embodiment, the piezoelectric transformer PT and a semiconductor component are mounted to different mounting surfaces on the double-sided printing substrate 50, and the resistors R6 and R7, which are connected in parallel to the primary electrode pair of the piezoelectric transformer PT, are provided. Accordingly, it is possible to protect a semiconductor component from a pyroelectric voltage generated on a primary side of a piezoelectric element surface-mounted to the double-sided printing substrate 50 by the reflow method.

In FIG. 13, the resistance of the resistor R6 and the resistance of the resistor R7 are the same, but these may be different. In other words, as long as the two conditions described above are satisfied, the resistance of the resistor R6 and the resistance of the resistor R7 can be set freely.

The technical concept of the present embodiment can also be applied to a printed circuit board that employs a reversible layout. A reversible layout means that, out of arrangement patterns for forming a plurality of substrates on a sheet for substrates, arrangement patterns of electronic components mounted on a front surface and arrangement patterns for electronic components mounted on a back surface are the same. By virtue of this embodiment, the present embodiment is also effective for a configuration having a reversible layout because resistors for a pyroelectric countermeasure are mounted to both surfaces.

FIG. 14A and FIG. 14B are cross-sectional views illustrating examples in which a plurality of power supply circuits 1401a and 1401b that use the piezoelectric transformer PT are arranged on the double-sided printing substrate 50. The cross sections here are cross sections in accordance with the B-B cutting line. Note that the same reference numerals are added to electronic components that have been already explained, and the explanation thereof is invoked. The plurality of power supply circuits 1401a and 1401b may be pyroelectric circuits as described above.

As illustrated by FIG. 14A, the technical concept of the embodiment can be applied even if a plurality of the piezoelectric transformer PT are arranged on the same mounting surface. As illustrated by FIG. 14B, the technical concept of the embodiment can be applied even if a plurality of the piezoelectric transformer PT are arranged on different mounting surfaces. The power supply circuits 1401a and 1401b which use the piezoelectric transformer PT are respectively independent circuits. Accordingly, by arranging the resistors R6 and R7 for each of the power supply circuits 1401a and 1401b, semiconductor components such as the transistor Tr are protected from pyroelectric voltages.

In this way, even if the plurality of power supply circuits 1401a and 1401b which use the piezoelectric transformer PT are arranged on the double-sided printing substrate 50, semiconductor components in each power supply circuit are protected. As explained by the embodiment, the piezoelectric transformer PT and a semiconductor component are mounted to different mounting surfaces in each of the plurality of power supply circuits 1401a and 1401b. Furthermore, the resistor R6 and the resistor R7 are respectively provided on the first mounting surface 301 and the second mounting surface 302. In addition, the resistor R6 and the resistor R7 are connected in parallel to the primary electrode pair of the piezoelectric transformer PT. Note that it is sufficient if a resistor is provided on only a mounting surface that will be loaded into the reflow oven first out of the two mounting surfaces. In other words, it is not the case that both of the resistor R6 and the resistor R7 are always necessary.

SUMMARY

As illustrated in FIG. 3 or the like, the double-sided printing substrate 50 has the first mounting surface 301 and the second mounting surface 302 which is on a surface opposite the first mounting surface 301. The piezoelectric transformer PT is surface-mounted to the first mounting surface 301. The piezoelectric transformer PT has the piezoelectric substance 100 which has the output electrode 103 and an input electrode, and the frame substrate 104 that supports the piezoelectric substance 100. The first input electrode 101 and the second input electrode 102 are examples of the input electrode. As illustrated in FIG. 1, the frame substrate 104 is arranged so as to surround the side surfaces of the piezoelectric substance 100. In addition, the frame substrate 104 has the plurality of external electrodes 109a through 109d that are electrically connected to the input electrodes or the output electrode. The second mounting surface 302 has a projection region onto which the piezoelectric substance 100 is projected. The projection region is a region onto which the top surface or the bottom surface of the piezoelectric substance 100 is projected in a normal direction of the second mounting surface 302. The first region 303 which is a mounting allowed region where electronic components are mounted is included in the projection region. The first region 303 is a region from the first location P1 to the second location P2. The first location P1 is a location at which, out of the end portions of the input electrode, an end portion farther from the output electrode 103 is projected onto the second mounting surface. More specifically, the first location P1 is a location at which a perpendicular line drawn from, out of the end portions of the input electrode, the end portion farther from the output electrode 103 toward the second mounting surface 302 intersects the second mounting surface 302. The second location P2 is a location at which, out of the end portions of the input electrode, an end portion closer to the output electrode 103 is projected onto the second mounting surface 302. More specifically, the second location P2 is a location at which a perpendicular line drawn from, out of the end portions of the input electrode, the end portion closer to the output electrode 103 toward the second mounting surface 302 intersects the second mounting surface. As described above, when the entirety of the projection region of the piezoelectric transformer PT is set as a mounting prohibited region of the electronic component, high-density integration of electronic components on the second mounting surface 302 cannot be achieved. Because the first region 303 has a low influence from, for example, an electric field from the piezoelectric transformer PT, in the case of this region it is possible to mount an electronic component with a decrease in the performance of the electronic component hardly introduced. In this way, by making the first region 303 be a region where electronic components can be mounted, it becomes possible to have high-density mounting of electronic components on the second mounting surface 302. As illustrated in FIG. 3 or the like, at the least some electronic components for configuring a driving circuit for driving the piezoelectric transformer PT are arranged on the first region 303. As illustrated in FIG. 3 or FIG. 9, the at least some electronic components that configure the driving circuit are the capacitor C3, the field-effect transistor Tr, or the inductor L1, for example.

As illustrated in FIG. 4, the first mounting surface 301 is a region on a first mounting surface, and may have the second region 401 that faces the piezoelectric substance 100. The second region 401 may be a mounting prohibited region in which mounting of electronic components is prohibited. By providing the second region 401, the piezoelectric substance 100 and electronic components cease to be in contact, and the piezoelectric substance 100 becomes capable of sufficient mechanical vibration. Note that an electronic component that is prohibited from being mounted on the second region 401 is a surface mount component (SMD), for example. Note that the second region 401 may be a region where electronic components having a height so that there is no contact with the piezoelectric substance 100 even if the piezoelectric substance 100 mechanically vibrates are mounted.

As illustrated in FIG. 4, the projection region described above may have the third region 402 from the second location P2 to the third location P3. The third region 402 may be a mounting prohibited region in which mounting of electronic components is prohibited. The third location P3 is a location at which, out of the end portions of the input electrode, an end portion far from the output electrode 103 is projected onto the second mounting surface 302. More specifically, the third location P3 is a location at which a perpendicular line drawn from, out of the end portions of the input electrode, the end portion far from the output electrode 103 toward the second mounting surface intersects the second mounting surface. As described above, the third region 402 is a region that is likely to be influenced by the piezoelectric substance 100. Accordingly, by prohibiting the arrangement of electronic components in the third region 402, decrease in the performance of such electronic components should be avoided.

As illustrated in FIG. 1, a space may be provided between the side surfaces of the piezoelectric substance 100 and the interior surface of the frame substrate 104. By this, the piezoelectric substance 100 can mechanically vibrate without interfering with the frame substrate 104. The piezoelectric substance 100 is thinner than the frame substrate 104, and a space is provided between the bottom surface of the piezoelectric substance 100 and the first mounting surface 301. By this, the piezoelectric substance 100 can mechanically vibrate without interfering with the first mounting surface 301.

As illustrated in FIG. 1, for the input electrode, the first input electrode 101 which is a first faced electrode provided on the top surface of the piezoelectric substance 100 and the second input electrode 102 which includes a second faced electrode on the bottom surface of the piezoelectric substance 100 may be comprised. As illustrated in FIG. 3, a portion out of the second input electrode 102 that functions as the second faced electrode extends to the top surface of the piezoelectric substance 100 via a side surface of the piezoelectric substance 100. Consequently, an electric field may be generated in a thickness direction of the piezoelectric substance 100. In addition, because the first input electrode 101 and some of the second input electrode 102 are respectively provided on the top surface of the piezoelectric substance 100, it is possible to support the piezoelectric substance 100 so that the piezoelectric substance 100 is suspended by the frame substrate 104.

As explained using FIG. 6, a difference between the coefficient of thermal expansion of the substrate of the double-sided printing substrate 50 and the coefficient of thermal expansion of the frame substrate 104 may be less than $6 \times 10^{-6}/°$ C. Consequently, even if the double-sided printing substrate 50 is mounted in the high voltage power supply 30 of the image forming apparatus 1, cracking is unlikely to occur in a soldering portion between the double-sided printing substrate 50 and the frame substrate 104.

As illustrated in FIG. 7, the photosensitive drum 6 is an example of an image carrier. The primary charger 2 is an example of a charging unit for uniformly charging an image carrier. The optical scanning apparatus 3 is an example of an exposure unit for forming an electrostatic latent image by exposing the image carrier. The developer 4 is an example of a developing unit for forming a toner image by developing the electrostatic latent image. The primary transfer roller 5, the intermediate transfer belt 10, and the secondary transfer roller 14 are an example of a transfer unit for transferring a toner image to a sheet. The high voltage power supply 30 is an example of a power supply apparatus for generating a charging voltage supplied to a charging unit, a developing voltage supplied to a developing unit, or a transfer voltage supplied to a transfer unit.

As explained using FIG. 11 or FIG. 12, the piezoelectric transformer PT and a semiconductor component are mounted to different mounting surfaces on the double-sided printing substrate 50. Furthermore, the resistors R6 and R7 that are connected in parallel to a primary electrode pair of the piezoelectric transformer PT are provided. Accordingly, it is possible to protect a semiconductor component from a pyroelectric voltage generated on a primary side of the piezoelectric substance 100 which is surface-mounted to the double-sided printing substrate 50 by using the reflow method. Note that is not necessary to provide both of the resistors R6 and R7. It is sufficient if a resistor is provided on, out of the first mounting surface 301 and the second mounting surface 302, a mounting surface that is soldered in a reflow oven first. In such a case, it is sufficient if the resistance of this resistor is greater than or equal to 6.0 k$\Omega$ and less than or equal to 3.0 M$\Omega$. Note that it is sufficient if the resistance of the resistor is a value such that a pyroelectric voltage decreases and a reduction in power supply performance of a power supply circuit that includes the piezoelectric transformer PT is within a predetermined range. The pyroelectric voltage is a voltage that is generated in the primary electrode pair of the piezoelectric transformer PT in accordance with a piezoelectric effect when the double-sided printing substrate 50 passes through a reflow oven in order to solder a semiconductor component to the second mounting surface 302. In a case where both of the resistors R6 and R7 are provided, it is sufficient if the resistance values of the resistors R6 and R7 are respectively 3.0 M$\Omega$ or less, and a combined resistance of the resistors R6 and R7 is 6.0 k$\Omega$ or more.

An example of a semiconductor component is a switching element for driving the piezoelectric transformer PT. A switching element such as the transistor Tr is more likely to suffer electrostatic withstand voltage breakdown in comparison to other semiconductor components. Accordingly, by applying the present embodiment, electrostatic withstand voltage breakdown of a switching element should be reduced.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-024262, filed Feb. 13, 2017, and Japanese Patent Application No. 2017-024263, filed Feb. 13, 2017 which are hereby incorporated by reference herein in their entirety.

What is claimed is:

1. A method of mounting an electronic component, the method comprising:
applying solder to a first mounting surface of a printed circuit board;
surface-mounting a piezoelectric transformer to the first mounting surface and mounting to the first mounting surface a resistor connected in parallel to a pair of input electrodes of the piezoelectric transformer;
soldering the piezoelectric transformer and the resistor to the first mounting surface by inserting the printed circuit board into a reflow oven;
applying solder to a second mounting surface of the printed circuit board;
mounting a semiconductor component for forming a driving circuit for driving the piezoelectric transformer to the second mounting surface; and
soldering the semiconductor component to the second mounting surface by inserting the printed circuit board into the reflow oven.

2. The method according to claim 1, wherein the resistor is a first resistor,
wherein the mounting of the semiconductor component for forming the driving circuit for driving the piezoelectric transformer on the second mounting surface includes mounting to the second mounting surface a second resistor connected in parallel to the pair of input electrodes of the piezoelectric transformer, and
wherein the soldering of the semiconductor component to the second mounting surface by inserting the printed circuit board into the reflow oven includes soldering the second resistor to the second mounting surface by inserting the printed circuit board into the reflow oven.

3. The method according to claim 1, wherein a resistance of the resistor reduces a pyroelectric voltage generated in the pair of input electrodes of the piezoelectric transformer by a piezoelectric effect when the printed circuit board passes through the reflow oven in order to solder the semiconductor component to the second mounting surface, and the resistance of the resistor has a value so that a decrease in power supply performance of a power supply circuit that includes the piezoelectric transformer is within a predetermined range, and
wherein the resistance of the first resistor is greater than or equal to 6.0 kΩ and less than or equal to 3.0 MΩ.

4. The method according to claim 2, wherein a resistance of the second resistor reduces a pyroelectric voltage generated in the pair of input electrodes of the piezoelectric transformer by a piezoelectric effect when the printed circuit board passes through the reflow oven in order to solder the semiconductor component to the second mounting surface, and the resistance of the second resistor has a value so that a decrease in power supply performance of a power supply circuit that includes the piezoelectric transformer is within a predetermined range, and
wherein the resistance of the second resistor is greater than or equal to 6.0 kΩ and less than or equal to 3.0 MΩ.

5. A printed circuit board comprising:
a first mounting surface;
a second mounting surface;
a first electronic component soldered to the first mounting surface; and
a second electronic component soldered to the second mounting surface,
wherein the first electronic component includes:
a piezoelectric transformer surface-mounted to the first mounting surface, and
a resistor mounted to the first mounting surface and connected in parallel to a pair of input electrodes of the piezoelectric transformer, and
wherein the second electronic component includes:
a semiconductor component mounted to the second mounting surface and configured to form a driving circuit for driving the piezoelectric transformer.

6. The printed circuit board according to claim 5, wherein the electrode is a first electrode, and
wherein the printed circuit board further comprises a second resistor mounted to the second mounting surface and connected in parallel to the pair of input electrodes of the piezoelectric transformer.

7. The printed circuit board according to claim 5, wherein a resistance of the resistor reduces a pyroelectric voltage generated in the pair of input electrodes of the piezoelectric transformer by a piezoelectric effect when the printed circuit board passes through the reflow oven in order to solder the semiconductor component to the second mounting surface, and the resistance of the resistor has a value so that a decrease in power supply performance of a power supply circuit that includes the piezoelectric transformer is within a predetermined range, and
wherein the resistance of the first resistor is greater than or equal to 6.0 kΩ and less than or equal to 3.0 MΩ.

8. The printed circuit board according to claim 6, wherein a resistance of the second resistor reduces a pyroelectric voltage generated in the pair of input electrodes of the piezoelectric transformer by a piezoelectric effect when the printed circuit board passes through the reflow oven in order to solder the semiconductor component to the second mounting surface, and the resistance of the second resistor has a value so that a decrease in power supply performance of a power supply circuit that includes the piezoelectric transformer is within a predetermined range, and
wherein the resistance of the second resistor is greater than or equal to 6.0 kΩ and less than or equal to 3.0 MΩ.

9. A power supply apparatus comprising:
the printed circuit board according to claim 5;
a piezoelectric transformer surface-mounted to the first mounting surface, and
a driving circuit configured to drive the piezoelectric transformer.

10. An image forming apparatus comprising:
an image carrier;
a charging unit configured to uniformly charge the image carrier;
an exposure unit configured to form an electrostatic latent image by exposing the image carrier;

a developing unit configured to form a toner image by developing the electrostatic latent image;

a transfer unit configured to transfer the toner image to a sheet; and the power supply apparatus according to claim 9, which is configured to generate a charging voltage supplied to the charging unit, a developing voltage supplied to the developing unit, or a transfer voltage supplied to the transfer unit.

11. A method for mounting an electric component, the method comprising:

applying solder to a second mounting surface of a printed circuit board;

mounting a semiconductor component and a resistor on the second mounting surface, the semiconductor component forming a driving circuit for driving a piezoelectric transformer, and the resistor connected in parallel to an input electrode pair of the piezoelectric transformer;

soldering the semiconductor component and the resistor on the second mounting surface by inserting the printed circuit board into a reflow oven;

applying solder to a first mounting surface of the printed circuit board;

surface-mounting the piezoelectric transformer on the first mounting surface; and soldering the piezoelectric transformer on the first mounting surface by inserting the printed circuit board into a reflow oven.

12. A printed circuit board comprising:

a first mounting surface;

a second mounting surface;

a first electronic component soldered to the first mounting surface; and a second electronic component soldered to the second mounting surface, wherein the first electronic component includes:
  a piezoelectric transformer surface-mounted to the first mounting surface, and wherein the second electronic component includes:
  a semiconductor component mounted to the second mounting surface and configured to form a driving circuit for driving the piezoelectric transformer, and
  a resistor mounted to the second mounting surface and connected in parallel to a pair of input electrodes of the piezoelectric transformer.

13. A power supply apparatus comprising:

the printed circuit board according to claim 12;

a piezoelectric transformer surface-mounted to the first mounting surface, and a driving circuit configured to drive the piezoelectric transformer.

14. An image forming apparatus comprising:

an image carrier;

a charging unit configured to uniformly charge the image carrier;

an exposure unit configured to form an electrostatic latent image by exposing the image carrier;

a developing unit configured to form a toner image by developing the electrostatic latent image;

a transfer unit configured to transfer the toner image to a sheet; and the power supply apparatus according to claim 13, which is configured to generate a charging voltage supplied to the charging unit, a developing voltage supplied to the developing unit, or a transfer voltage supplied to the transfer unit.

* * * * *